(12) United States Patent
Miklis

(10) Patent No.: US 9,705,304 B2
(45) Date of Patent: Jul. 11, 2017

(54) METHOD FOR IDENTIFYING ARCING FAULTS AND CIRCUIT BREAKER

(71) Applicant: ELLENBERGER & POENSGEN GMBH, Altdorf (DE)

(72) Inventor: Markus Miklis, Pfeifferhuette (DE)

(73) Assignee: Ellenberger & Poensgen GmbH, Altdorf (DE)

( * ) Notice: Subject to any disclaimer, the term of this patent is extended or adjusted under 35 U.S.C. 154(b) by 969 days.

(21) Appl. No.: 13/974,416

(22) Filed: Aug. 23, 2013

(65) Prior Publication Data

US 2016/0248240 A1 Aug. 25, 2016

Related U.S. Application Data

(63) Continuation of application No. PCT/EP2011/002180, filed on May 3, 2011.

(30) Foreign Application Priority Data

Feb. 23, 2011 (DE) .......................... 10 2011 012 004

(51) Int. Cl.
*H02H 1/00* (2006.01)
*G01R 31/02* (2006.01)
*H02H 3/027* (2006.01)

(52) U.S. Cl.
CPC ......... *H02H 1/0015* (2013.01); *G01R 31/025* (2013.01); *H02H 3/027* (2013.01)

(58) Field of Classification Search
CPC ..... H02H 1/0015; H02H 3/027; G01R 31/025
See application file for complete search history.

(56) References Cited

U.S. PATENT DOCUMENTS

| | | | | |
|---|---|---|---|---|
| 5,432,455 A * | 7/1995 | Blades | ................ | G01R 31/021 324/520 |
| 5,434,509 A * | 7/1995 | Blades | ................ | G01R 31/021 324/520 |
| 5,729,145 A * | 3/1998 | Blades | ................ | G01R 31/1272 324/522 |
| 6,625,550 B1 * | 9/2003 | Scott | ................... | H01H 71/125 361/63 |
| 2006/0109009 A1 * | 5/2006 | Banke | ................. | H02H 1/0015 324/536 |

FOREIGN PATENT DOCUMENTS

| | | |
|---|---|---|
| GB | 2 348 751 A | 10/2000 |
| WO | WO 94/22031 A1 | 9/1994 |
| WO | WO 2008/049436 A1 | 5/2008 |

OTHER PUBLICATIONS

English translation of the International Preliminary Report on Patentability for PCT Application No. PCT/EP2011/002180.

* cited by examiner

*Primary Examiner* — Zeev V Kitov
(74) *Attorney, Agent, or Firm* — Muncy, Geissler, Olds & Lowe, P.C.

(57) ABSTRACT

A method for identifying arcing faults within a circuit having a system frequency, an electrical current and an electrical voltage, in which method an interference signal occurring, which has a frequency below an LF1 frequency and a current intensity above an LF1 limit threshold, defines an LF1 signal, in which a number of interference signals occurring, which have a frequency below an HF2 frequency, are combined to form an HF2 signal if the number of interference signals occurring is greater than or equal to an HF2 number and the time interval between two successive interference signals is less than an HF2 time, in which the number of time periods with a respective length which amounts to an accumulation length and which follow one another directly in time and in which in each case at least one HF2 signal is present define an accumulation when the number of time periods is greater than or equal to an accumulation number.

3 Claims, 10 Drawing Sheets

METHOD FOR IDENTIFYING ARCING FAULTS AND CIRCUIT BREAKER

This nonprovisional application is a continuation of International Application No. PCT/EP2011/002180, which was filed on May 3, 2011, and which claims priority to German Patent Application No. DE 10 2011 012 004.1, which was filed in Germany on Feb. 23, 2011, and which are both herein incorporated by reference.

BACKGROUND OF THE INVENTION

Field of the Invention

The present invention relates to methods for identifying arcing faults within an electrical circuit having a system frequency, an electrical current and an electrical voltage, and to a circuit breaker operating according thereto.

Description of the Background Art

So-called arcing faults can occur within an electrical circuit. Arcing faults are undesired currents between at least one element of the electrical circuit and a further element, a potential difference existing between the two elements. Usually, the two elements are not in direct electrical contact, rather there is normally an insulation between them. If the insulation is defective owing to the fact that, for example, it has become porous on account of aging or has been at least partly removed on account of mechanical action, then it is possible for a further substance to penetrate between the two elements and settle there. Said substance can be liquid, for example water, or gaseous, in particular air. On account of the lack of insulation effect, in the case of the currents and/or voltages occurring within the electrical circuit it is possible for an electrical flashover, the arcing fault, to occur between the two elements.

A distinction is drawn between three different types of arcing faults, also called arc. In the case of the so-called wet arc, the penetrating substance is a liquid, usually water, which has a high electrical conductivity. The further element is usually electrically connected to ground or grounded and not necessarily part of the electrical circuit. On account of the high electrical conductivity and thus on account of the low electrical resistance of the liquid, comparatively high currents can occur between the two elements, which can lead to an impairment of possible loads of the electrical circuit.

In the case of a so-called parallel arc, the penetrating substance is a gas, in particular air. The further element is usually electrically connected to ground or grounded and not necessarily part of the electrical circuit. On account of the electric field between the two elements, the gas is ionized and an electrical current can flow between the two elements. Such a flashover is possible already at potential differences of approximately 30 volts. On account of the comparatively poor electrical conductivity of the ionized gas, the electrical current between the two elements is not constant, but rather at high frequency, which leads to a high thermal charging of the two elements, of the substance and/or of their respective environment. The temperatures occurring in this case reach as much as a few thousand degrees, with the result that further damage to the insulation, the elements and/or the respective environment is not ruled out.

In aircraft, in particular, this risk is particularly great since installed cables are usually combined to form wiring harnesses. If the first element is one of these cables, an arcing fault occurring can damage the entire wiring harness and thus jeopardize the operating safety of the aircraft. Furthermore, it is possible for elements surrounding the wiring harness or the wiring harness itself to catch fire.

A further type of arcing fault is the serial arc. In the case of the latter, the further element is the first element itself, which is usually a cable. The flashover takes place along the cable, the substance that penetrated usually being air, which is in electrical contact with the cable as a result of an insulation that has become porous. The mechanism leading to this arcing fault is comparable with the parallel arc and likewise also the effects thereof.

WO 94/22031 A1 discloses two methods for identifying arcing faults. The first of the two methods provides for monitoring the electrical current or the electrical voltage within an AC electrical circuit with regard to interference signals having a length substantially corresponding to half a system frequency.

In this case, the time periods formed between two successive interference signals are analyzed with regard to their length, their beginning or their end. If two time periods that are successive with the interval of a system frequency are present, a counter is incremented. If a specific number of regular interference-signal-free time periods is present, an arcing fault is identified. Instead of this, after registration of the specific number of arcing faults, the time periods can continue to be counted. If a time period is irregular, the counter is reduced by a predefined value. If the counter has reached a specific second number, an arcing fault is reported.

The second method involves checking interference signals with regard to their irregularities. If successive interference signals differ in terms of their position relative to the system frequency and their length, an arcing fault is identified. In addition, the rise in the respective interference signal is analyzed, since the inventor recognized that interference signals caused by arcing faults have a temporally steeper rise than possible interference signals caused by semiconductor switching elements within the electrical circuit.

The methods presented are performed by a circuit breaker, a monitoring element and a portable analysis device.

WO 2008/049436 A1 discloses a circuit breaker for monitoring loose connections in an electrical circuit. The circuit breaker trips if a high-frequency signal is detected in the electrical circuit to be monitored. In one development, the electrical circuit is interrupted by means of the circuit breaker if a specific number of such signals was determined within a predefined time window.

GB 2 348 751 A discloses a method for monitoring arcing faults within an electrical circuit realized in an aircraft. In this case, the rise of interference signals is registered and an arcing fault is identified on the basis thereof. In this case, the number of such interference signals which occur within a time window corresponding to half the system frequency is counted.

SUMMARY OF THE INVENTION

It is therefore an object of the present invention to provide a suitable method for identifying arcing faults within an electrical circuit having a system frequency, an electrical current and an electrical voltage, and a suitable circuit breaker.

Hereinafter, an interference signal can be understood to mean a deviation of an actual value of an electrical current from an associated desired value. The deviation has a time duration and a specific frequency during said time duration, wherein the deviation can also have a number of frequencies or a frequency band during this time span. It is assumed below that an interference signal can comprise only one frequency, but the interference signal can also comprise a plurality of frequencies.

If the frequency of the deviations are below an LF1 frequency, and meanwhile the electrical current lies above an LF1 limit threshold, then this interference signal is designated as LF1 signal. An LF2 signal is understood to mean an interference signal whose frequency is lower than an LF2 frequency, while at the same time the current intensity is greater than an LF2 limit threshold. The length of the LF1 signal and the length of the LF2 signal denote the time duration of the interference signal having the respective parameters above.

An HF2 signal denotes a number of interference signals which have a frequency below an HF2 frequency. In this case, the time interval between two successive interference signals is less than an HF2 time, and the number of interference signals is greater than an HF2 number. If a further interference signal having a frequency below the HF2 frequency occurs within a time span which is less than the HF2 time after the last interference signal of an HF2 signal, then the further interference signal is counted as being part of the HF2 signal and the length of the HF2 signal is correspondingly lengthened. This has the effect, inter alia, that the time interval between two successive HF2 signals is greater than the HF2 time.

If a number of time periods within which at least one HF2 signal in each case is present directly succeed one another, then this is designated as an accumulation. In this case, the length of each of the time periods amounts to an accumulation length. The number of accumulations is greater than or equal to an accumulation number. If a further HF2 signal occurs in a further time period having a temporal length corresponding to the accumulation length after the last time period of an accumulation containing an HF2 signal, then the time period containing the further HF2 signal is counted as being part of the accumulation and the length of the accumulation is correspondingly lengthened.

It is possible, in particular, for an interference signal to contribute to a number of the abovementioned signals and/or the accumulation. Furthermore, it is assumed hereinafter that, if a signal starts a time period, a time span, a temporal phase or a temporal period, or the time period, the time span, the temporal phase or the temporal period is started by means of the signal, the signal is counted as being part of the time period, the time span, the temporal phase or the temporal period, that is to say lies within the time period, the time span, the temporal phase or the temporal period.

The method uses a counter designated hereinafter as WET1 accumulation counter. At the start of the method, the WET1 accumulation counter is set to zero (0). Whenever the WET1 accumulation counter is zero (0), if an accumulation is identified, the WET1 accumulation counter is incremented by one (1). In other words, the counter reading of the WET1 accumulation counter is incremented by one (1) as soon as an accumulation is identified within the electrical current of the electrical circuit. With each further identified accumulation, the counter reading of the WET1 accumulation counter is incremented by one (1) as long as the time interval between two successive accumulations is greater than a first accumulation time and less than a second accumulation time. If this is not the case, then the WET1 accumulation counter is reset to zero (0).

If the counter reading of the WET1 accumulation counter reaches an accumulation value, then a waiting period is started and the counter reading of the WET1 accumulation counter is not changed further in particular during the waiting period. If, during the waiting period, two successive accumulations have a time interval which is less than a third accumulation time, then the waiting period is terminated and the WET1 accumulation counter is set to zero (0). Likewise, at least one LF1 signal, preferably one, two or three LF1 signals, leads to a termination of the waiting period and a resetting of the WET1 accumulation counter to zero (0). If the waiting period ends regularly, that is to say if the waiting period is not terminated, then an arcing fault is reported after the waiting period has elapsed.

If an LF2 signal having a duration longer than an LF2 limit length is measured within the electrical current, the WET1 accumulation counter is suitably set to zero (0) and left at zero (0) for a parallel time period. Therefore, the WET1 accumulation counter is not incremented by one (1) during the parallel time period if an accumulation is identified in the meantime. In the case where such an LF2 signal is measured during the waiting period, the latter is terminated and the WET1 accumulation counter is set to zero (0) and likewise left at zero (0) for the parallel time period.

The parallel time period is ended whenever an LF2 signal having a length shorter than the LF2 limit length is measured during the parallel time period. Likewise, the parallel time period is terminated whenever the electrical voltage was less than a termination voltage for a first termination time span, or whenever no LF2 signal was measured for a time period having the length of a second termination time span.

By contrast, an arcing fault is reported if a number of HF2 signals was measured within the parallel time period, the time interval between two successive HF2 signals in each case being greater than or equal to a first arcing fault time span. In this case, one of the intervals between two of the HF2 signals is greater than or equal to a second arcing fault time span, the latter being greater than or equal to the first arcing fault time span.

The number of HF2 signals which lead to a reported arcing fault is dependent on possible LF2 signals within a third arcing fault time span. The third arcing fault time span denotes the temporally first section of the parallel time period.

If a number of LF2 signals which lies between a second arcing fault number and a third arcing fault number inclusive is measured within the third arcing fault time span, then the number of HF2 signals leading to the reporting is greater than or equal to a first arcing fault number. In particular, the third arcing fault number is greater than the second arcing fault number. If a number of LF2 signals which is greater than the third arcing fault number was measured within the third arcing fault time span, then the arcing fault is reported only after the measurement of a number of HF2 signals that is greater than or equal to a fourth arcing fault number.

The method uses a counter designated hereinafter as WET2 accumulation counter, and an LF1 counter. Upon the start of the method, the WET2 accumulation counter and the LF1 counter are in each case set to zero (0). If the WET2 accumulation counter is zero (0) and an accumulation is identified, the WET2 accumulation counter is incremented by one (1). In other words, the counter reading of the WET2 accumulation counter is incremented by one (1) as soon as an accumulation is identified within the electrical current of the electrical circuit. With each further identified accumulation, the counter reading of the WET2 accumulation counter is incremented by one (1) as long as the time interval between two successive accumulations is less than the third accumulation time. If no accumulation is measured after one of the accumulations for a time period that is greater than a third accumulation time, then either the WET2 accumulation counter is set to zero (0) if the counter reading of the WET2 accumulation counter is less than or equal to a first WET2 limit value, or an LF period is started if the counter reading of the WET2 accumulation counter is greater than the first WET2 limit value. In particular, the counter reading of the WET2 accumulation counter is not incremented further within the LF period.

Each LF1 signal measured within the LF period leads to an incrementing of the LF1 counter by one (1). If the counter reading of the LF1 counter exceeds a WET2 limit value, then an arcing fault is reported. If the counter reading is less than the WET2 limit value after the LF period has elapsed, the WET2 accumulation counter and the LF1 counter are in each case set to zero (0).

In an embodiment of the invention, the electrical voltage is monitored. If, for a time period that is longer than a second SPG time span, the electrical voltage is less than an SPG voltage, then the WET2 accumulation counter and the LF1 counter are set to zero (0). In this case, the SPG voltage is advantageously constant, but can likewise be a variable threshold value below or above a desired voltage. The two counters are likewise reset if the lengths of two successive high time spans differ by more than a third SPG time span. The term high time spans denotes the time span within which the voltage is greater than the SPG voltage. If appropriate, in both cases the LF period is terminated if the latter has already begun. If the two counters should be set to zero (0) on account of the electrical voltage, then the WET2 accumulation counter and the LF1 counter are subsequently not altered for a first SPG time span.

Expediently, the WET2 accumulation counter and the LF1 counter are reset to zero (0) and not altered during the subsequent parallel time period if an LF2 signal is measured which has a length greater than the LF2 limit length. In combination therewith, the LF period is terminated if the latter has already begun.

An arcing fault is reported if within the parallel time period between all successive HF2 signals the time interval is greater than or equal to the first arcing fault time span, wherein one of the intervals is greater than or equal to the second arcing fault time span. In this case, the number of HF2 signals which leads to the reporting is dependent on possible LF2 signals which are measured within the third arcing fault time span of the parallel time period in the electrical current. If the number of measured LF2 signals is greater than or equal to the second arcing fault number and less than or equal to the third arcing fault number, then the arcing fault is reported if a number of HF2 signals which corresponds at least to the first arcing fault number was measured within the parallel time period. If the number of measured LF2 signals is greater than the third arcing fault number, then the arcing fault is reported only after a number of HF2 signals that is greater than or equal to the fourth arcing fault number.

The parallel time period is ended and no arcing fault is reported if, during the parallel time period, the length of an LF2 signal is shorter than the LF2 limit length or no LF2 signal was measured for a time period having a length corresponding at least to the length of the second termination time span. If the electrical voltage should be less than the termination voltage within the parallel time period for the first termination time span, then the parallel time period is ended and no arcing fault is reported either.

The method provides for using a serial time period. If an HF2 signal is registered outside the serial time period in the electrical current, then the serial time period is started. The LF1 signals possibly present in the electrical current are counted in the serial time period. In this case, only those LF1 signals are counted between which there is a time period lying between a fifth termination time span and a sixth termination time span, the fifth termination time span being less than the sixth termination time span. In a first measurement phase of the serial time period, which begins with the start of the serial time period, the HF2 signals possibly present in the electrical current are counted. In this case, only those HF2 signals are counted whose time interval relative to the respective preceding HF2 signal lies between a fourth termination time span and a third termination time span, the fourth termination time span being less than the third termination time span. If one of the intervals should be greater than the third termination time span, then the first measurement phase is terminated and the serial time period is also ended.

If the number of HF2 signals counted within the first measurement phase is equal to a first serial number, wherein the HF2 signal starting the serial time period is counted among the number of counted HF2 signals, then a holding period is started. In particular, the first measurement phase is ended if the number of measured HF2 signals is equal to the first serial number, and the holding period is started suitably thereafter. In this case, in particular the first measurement phase comprises that temporally last HF2 signal by means of which the number of measured HF2 signals corresponds to the first serial number, since the temporally last HF2 signal ends the first measurement phase and does not start the holding period.

After the holding period has elapsed, in a preferably directly following second measurement phase, the HF2 signals possibly present in the electrical current are counted whose time interval relative to the preceding HF2 signal lies between the fourth termination time span and the third termination time span. If one of the intervals should be greater than the third termination time span, then the second measurement phase is terminated and the serial time period is also ended. In particular, the temporally first HF2 signal of the second measurement phase is counted if the temporally succeeding HF2 signal has in relation to the first a time interval that lies between the fourth termination time span and the third termination time span.

If the number of HF2 signals counted within the second measurement phase is equal to a second serial number, the number of LF1 signals is checked. In particular, the second measurement phase is ended if the number of measured HF2 signals is equal to the second serial number, and the serial time period is likewise ended suitably. If the number of LF1 signals counted within the serial time period is greater than a third serial number, or if the number of LF1 signals counted within the serial time period is equal to the third serial number, and no further LF1 signal was registered in the electrical current for at least the fifth termination time span after the last counted LF1 signal, an arcing fault is reported.

In an embodiment of the invention, the electrical voltage is monitored. If, for a time period that is longer than the second SPG time span, the electrical voltage is less than the SPG voltage, then the serial time period is ended if the latter has already begun and is not started for the first SPG time span. In other words, an HF2 signal measured within the SPG time span does not lead to the serial time period being started. If the lengths of two successive high time spans differ by more than the third SPG time span, then the serial time period is ended if the latter has already begun and is not started for the first SPG time span.

Advantageously, the serial time period is ended if the latter has already begun and in any case is not started for the parallel time period if an LF2 signal is measured which has a duration longer than the LF2 limit length. If, during the parallel time period for a time period having the length of the second termination time span, no LF2 signal was measured, or if the length of a measured LF2 signal is less than the LF2 limit length, or if the electrical voltage was less than the termination voltage for the first termination time span, then the parallel time period is ended.

If, within the temporally first section of the parallel time period, having the length of the third arcing fault time span, a number of LF2 signals, the LF2 signal that starts the parallel time period likewise being counted among them, is counted which lies between the second arcing fault number and the third arcing fault number inclusive and a number of HF2 signals is counted which is greater than or equal to the first arcing fault number, than an arcing fault is reported. If more LF2 signals are measured in the first section, the LF2 signal that starts the parallel time period likewise being counted among them here, then an arcing fault is reported only after at least a number of HF2 signals that is greater than or equal to the fourth arcing fault number has been counted in the parallel time period. In both cases, only the HF2 signals whose time interval relative to the respective directly preceding HF2 signal is greater than the first arcing fault time span are counted within the parallel time period, and the arcing fault is reported only if one of the intervals is greater than or equal to the second arcing fault time span.

If an LF2 signal is measured which has a duration longer than the LF2 limit length, then the parallel time period is started. The third arcing fault time span likewise begins each time with the parallel time period. The parallel time period is ended whenever either an LF2 signal whose length is shorter than the LF2 limit length is measured, or the electrical voltage of the electrical circuit was less than the termination voltage for the first termination time span, or no LF2 signal was measured for a time period having the length of the second termination time span.

If, within the third arcing fault time span, a number of LF2 signals that lies between a second arcing fault number and a third arcing fault number inclusive and a number of HF2 signals that is greater than or equal to a first arcing fault number are measured, then an arcing fault is reported. If the number of LF2 signals measured within the third arcing fault time span is greater than the third arcing fault number, then an arcing fault is reported if the number of HF2 signals registered during the parallel time period exceeds the fourth arcing fault number. The third arcing fault number is suitably greater than the second arcing fault number.

The arcing fault is reported in both cases, however, only when the time interval between in each case two directly successive HF2 signals within the parallel time period is greater than or equal to the first arcing fault time span and one of the intervals is greater than or equal to the second arcing fault time span.

At least a number of the methods described suitably proceed in parallel with one another, provided that they are not mutually exclusive.

An electrical circuit having an electrical voltage, an electrical current and a system frequency is monitored by means of the circuit breaker. The circuit breaker is provided and designed for carrying out at least one of the methods described above. In particular, the circuit breaker has a monitoring unit for the electrical voltage and a monitoring unit for the electrical current, such that LF1 signals, LF2 signals and/or HF2 signals can be identified. The monitoring units are expediently configured in such a way that the signals can be determined directly from the respective measurement variables, that is to say that the measurement variables for example need not firstly be transferred into the frequency domain and analyzed there.

In an embodiment of the invention, the circuit breaker is designed to carry out all of the independent methods above. In this way, a large number of different types of arcing fault can be identified. Advantageously, the methods are performed simultaneously, provided that they are not mutually exclusive.

The circuit breaker suitably has an interruption unit. The interruption unit interrupts the electrical circuit as soon as an arcing fault is reported. In this way, the arcing fault is ended, such that uncontrolled discharging of a possible battery is ended or thermal heating of the components or of the environment of the electrical circuit is prevented.

The described methods and the circuit breaker are suitable, in particular, for an electrical circuit having a system frequency of 400 Hz, use at a system frequency of between 300 Hz and 1 kHz also being conceivable. Likewise, an application in an electrical circuit having a lower system frequency through to an application in an electrical circuit within which a DC current flows is also conceivable. Advantageously, the electrical voltage of the electrical circuit is 115 V or between 220 V and 230 V. In particular, at least one of the methods or the circuit breaker is employed within an electrical circuit of an aircraft or is used there.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

Mutually corresponding parts are provided with the same reference signs in all the figures.

DETAILED DESCRIPTION

Figure 1:
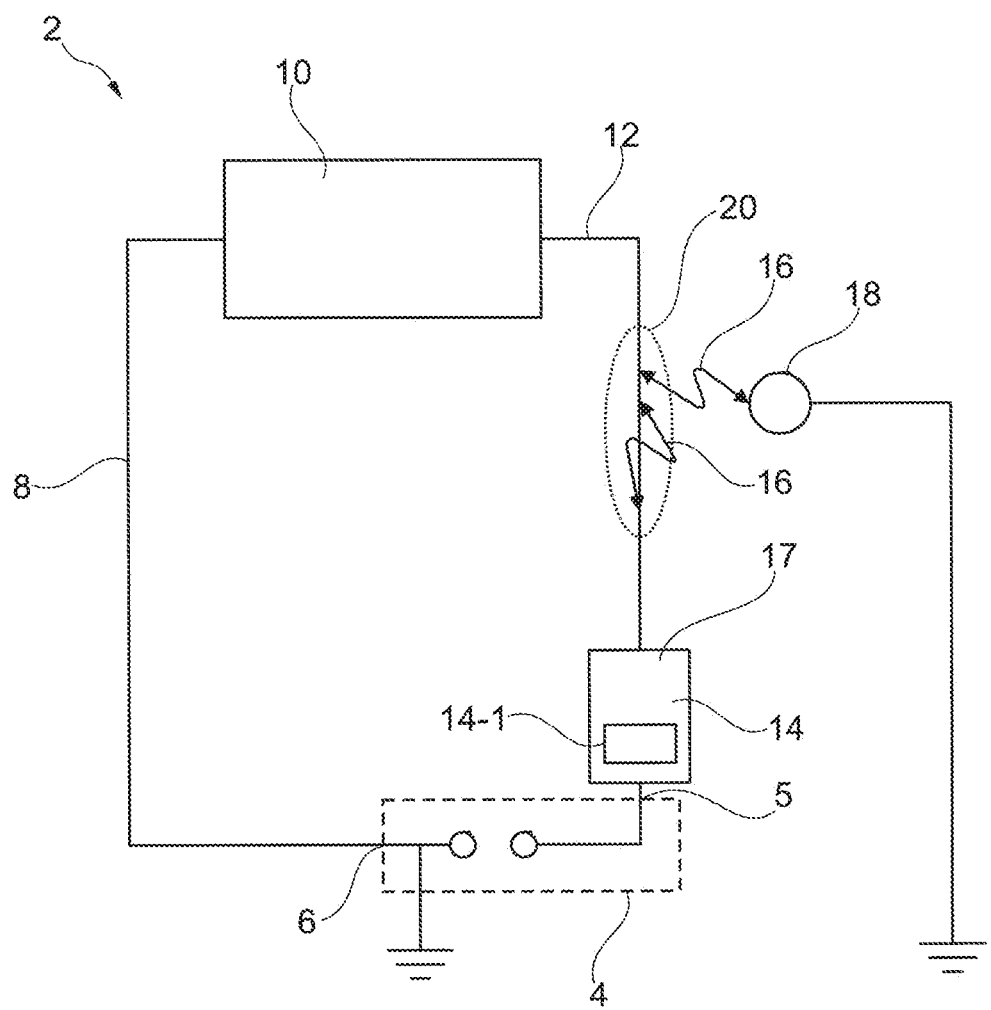
FIG. 1 schematically shows an electrical circuit with a circuit breaker.

FIG. 1 illustrates an electrical circuit 2. The electrical circuit 2 comprises an electrical current source 4 having two terminals 5, 6 one of the terminals 6 being electrically connected to ground. Said terminal 6 is electrically connected to a load 10 via an electrical line 8. The load 10 is, for example, an electrical servomotor, a lamp, or a sensor. A circuit breaker 14 is electrically connected to the load 10 via a further electrical line 12, the circuit breaker 14 being connected to one of the terminals 5 of the current source 4. The circuit breaker 14 includes a processor 14-1 and is designed to identify arcing faults 16 within the electrical circuit 2 and to interrupt the electrical circuit 2 by means of an interruption unit 17 after identification. The arcing fault 16 occurs for example between the electrical line 12 and a further element 18 connected to ground, wherein for example an insulation of the electrical line 12 is damaged in a region 20 in the vicinity of the element 18 connected to ground. By way of example, either air or an electrically conductive liquid, such as salt water, in particular, is situated between the element 18 and the electrical line. The arcing fault 16 can also occur along the electrical line 12.

The current source 4 supplies an electrical current 22, which is for example an AC current having a sinusoidal profile and has a rated current intensity. The electrical voltage 24 generated by means of the current source 4 has a similar profile, its rated voltage value being 115 volts, for example. The frequency of the current 22 and that of the voltage are in each case equal to a system frequency 26, which is 400 Hz, in particular. The electrical circuit 2 is preferably realized in an aircraft. Expediently, the terminal 6 is at the same electrical potential as the skin of the aircraft. It is likewise conceivable that, if the electrical circuit 2 is not realized in an aircraft, the terminal 6 and the element 18 are grounded.

Figure 2:
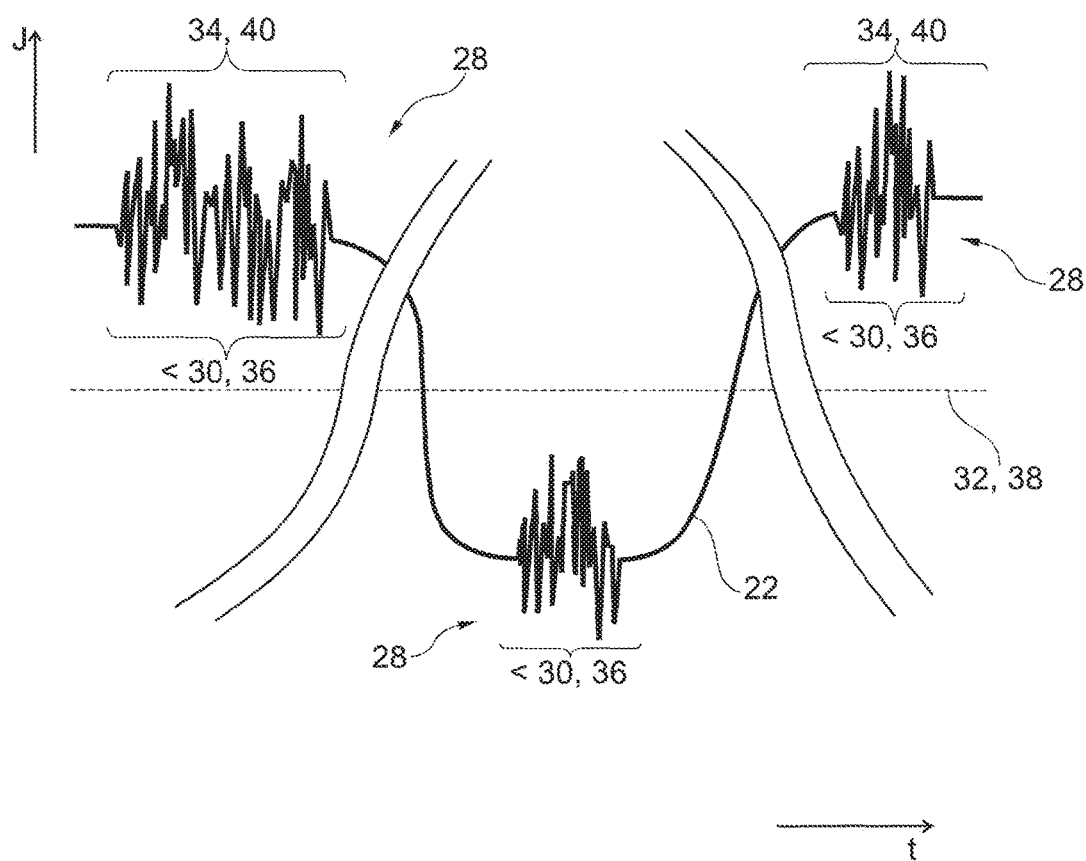
FIG. 2 shows a number of LF1 or LF2 signals.
Figure 10:
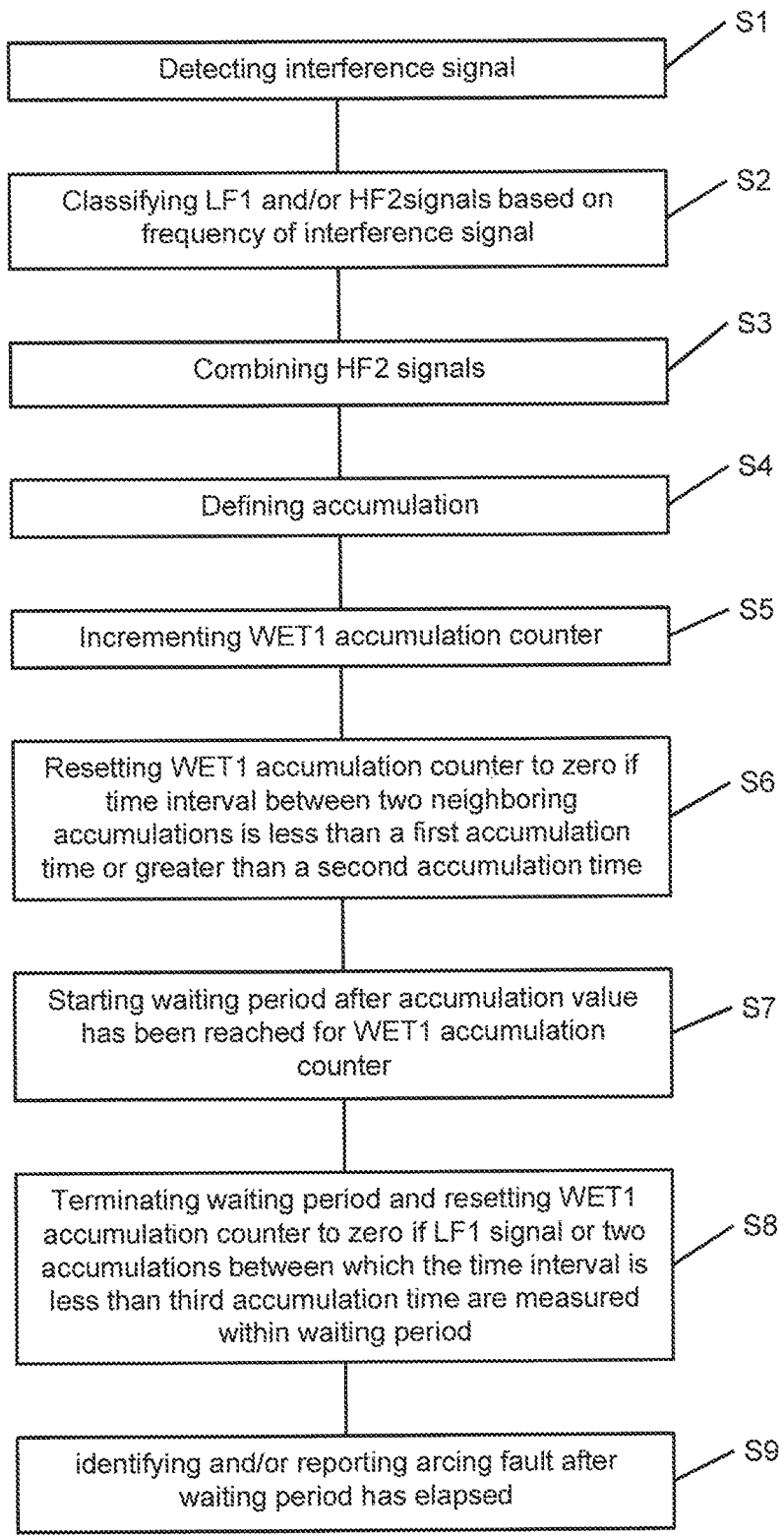
FIG. 10 is a flowchart illustrating a flow of a method for identifying arcing faults within an electrical circuit according to the present application.

FIG. 2 shows a number of interference signals 28 within the temporal profile of the electrical current 22 (step S1 in FIG. 10). In this case, the profile of the electrical current 22 is for example not sinusoidal, but rather, in particular with regard to comparative ease of explanation, rectangular. However, this does not restrict the invention in any way.

The frequency of each of the signals 28 lies below an LF1 frequency 30, which is 30 kHz in particular. The electrical current 22 of the first of the interference signals 28 lies above an LF1 limit threshold 32, which amounts to one third of the rated current, for example. This interference signal 28 is designated as an LF1 signal 34 (step S2 in FIG. 10). The third of the interference signals 28 likewise meets the two criteria of an LF1 signal 34, according to which the frequency of the interference signal 28 is less than the LF1 frequency 30 and according to which the electrical current 22 of the interference signal 28 is greater than the LF1 limit threshold 32. In this case, the first LF1 signal 34 is longer than the second LF1 signal 34, that is to say that the temporal length of the first LF1 signal 34 is greater than the temporal length of the second LF1 signal 34. The second of the interference signals 28 is not an LF1 signal 34 since, although the frequency of the interference signal 28 is less than the LF1 frequency 30, the electrical current 22 during the duration of the second interference signal 28 is also less than the LF1 limit threshold 32.

If the frequency of the individual interference signals 28 is less than an LF2 frequency 36, which is 400 Hz, for example, and in particular is equal to the system frequency 26, and the electrical current 22 is also greater than an LF2 limit threshold 38, which is suitably equal to the rated current, then the interference signals 28 are designated as LF2 signals 40. The difference between the LF1 signal 34 and the LF2 signal 40 is thus merely the respective thresholds of the frequency and also of the electrical current 22 of the respective interference signals 28. In particular, the interference signal 28 designated as LF2 signal 40 is also designated as LF1 signal 34.

The circuit breaker 6 suitably analyzes the temporal profile of the electrical current 22 and derives therefrom the frequency of the possible interference signals 28. In comparison with, for example, a Fourier analysis of the profile of the electrical current 22, this has the advantage that the frequencies of the interference signals 28 can be analyzed within a specific time range, without having to expect possible artifacts on account of the temporal limitation of the time range. Furthermore, it is thereby possible to reduce the calculation complexity, and there are likewise no restrictions for the length of the time range to be analyzed.

Figure 3:
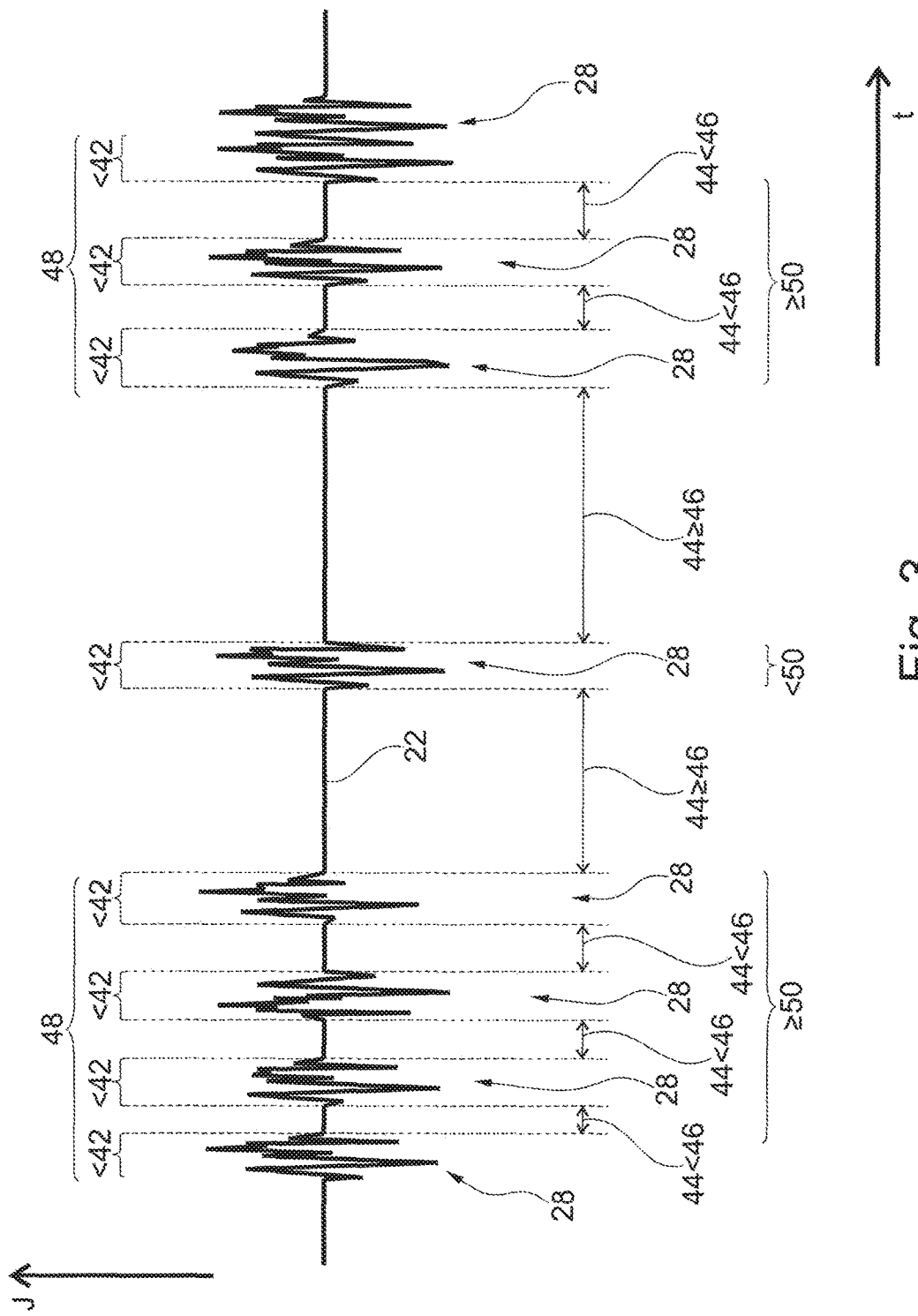
FIG. 3 shows a number of HF2 signals.

FIG. 3 shows a further temporal profile of the electrical current 22. The electrical current 22 comprises a number of interference signals 28, the frequency of each of the interference signals 28 being less than an HF2 frequency 42. The HF2 frequency 42 is 3.3 MHz, for example. Each of the interference signals 28, the respective length of which can vary, has a time interval 44 relative to the respective preceding interference signal 28 (step S2 in FIG. 10). If, for a number of temporally directly successive interference signals 28, the respective time interval 44 is less than an HF2 time 46, then these interference signals 28 are combined to form an HF2 signal 48 if the number of such interference signals 28 exceeds an HF2 number 50 or corresponds to the HF2 number 50 (step S3 in FIG. 10). The HF2 number 50 is two, in particular. By way of example, the first of the HF2 signals 48 illustrated comprises four interference signals 28, and the second of the HF2 signals 48 illustrated comprises three interference signals 28, wherein here the temporally last of the interference signals 28 has a comparatively long length.

Figure 4:
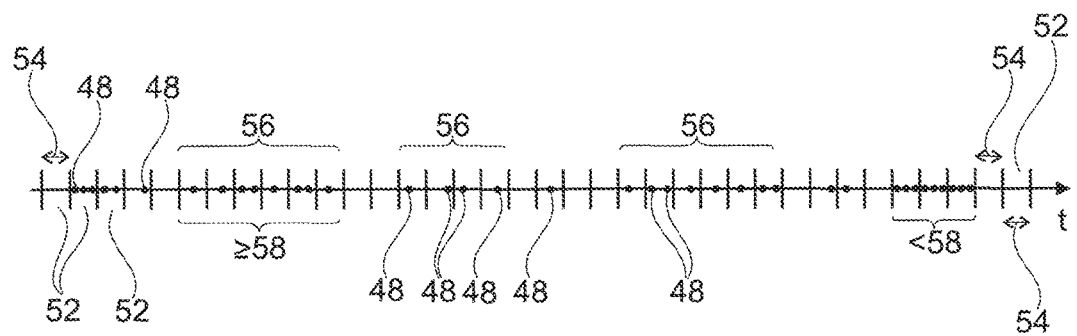
FIG. 4 shows a number of accumulations.

FIG. 4 illustrates a number of HF2 signals 48. Each point respectively represents an HF2 signal 48, wherein the length of the HF2 signals 48 can indeed vary. The time span within which the HF2 signals 48 are measured is subdivided into individual time periods 52. In particular, the total time span for which the electrical circuit 2 is operated is subdivided into the time periods 52. The length of each of the time periods 52 is equal to an accumulation length 54, which is suitably 100 μs. All temporally related time periods 52 within which in each case at least one HF2 signal 48 was registered are combined to form an accumulation 56 if the number of such time periods 52 is greater than or equal to an accumulation number 58 (step S4 in FIG. 10). The accumulation number 58 is equal to four, in particular. Consequently, at least four time periods 52 adjacent to one another in each case are combined to form one of the accumulations 56 if at least one HF2 signal 48 was measured in each of the respective time periods 52. The time interval between two directly successive HF2 signals here can be either greater or less than the accumulation length 54, but not greater than double the accumulation length 54. It is likewise possible for a plurality of HF2 signals 48 to have been measured within one of the time periods 52.

In particular, the length of each of the accumulations 56 is a multiple of the accumulation length 54. By way of example, the circuit breaker 14 comprises a microprocessor which can process the HF2 signals 48 in each case only with a specific temporal clock corresponding to the accumulation length 54. In particular, the circuit breaker 14 has an integration unit, which counts all HF2 signals 48 of a single time period 52, for example by means of a capacitor, and which forwards the measured number to the microprocessor after the time period 52 has elapsed.

If no HF2 signal 48 is measured in one of the time periods 52, and here in each case at least one HF2 signal 48 was measured within the temporally directly preceding time periods 52 which are temporally related, and here the number of such time periods is less than the accumulation number 58, then these related time periods 52 are not an accumulation 56, irrespective of how many HF2 signals 48 were measured in total in such time periods 52. In particular, the temporally last of the illustrated time periods 52 which contain an HF2 signal 48 are not an accumulation 56. Although nine HF2 signals 48 were registered within the three time periods 52, a time period 52 containing no HF2 signal 48 in each case precedes the first and the last of those time periods 52. Consequently, the number of related time periods 52 which contain at least one HF2 signal 48 is only three. By contrast, the second of the accumulations 56 illustrated meets the above criteria. Although this accumulation 56 only comprises four HF2 signals 48, the HF2 signals 48 in each case lie in a different time period 52, and the time periods 52 temporally directly succeed one another.

Figure 5:
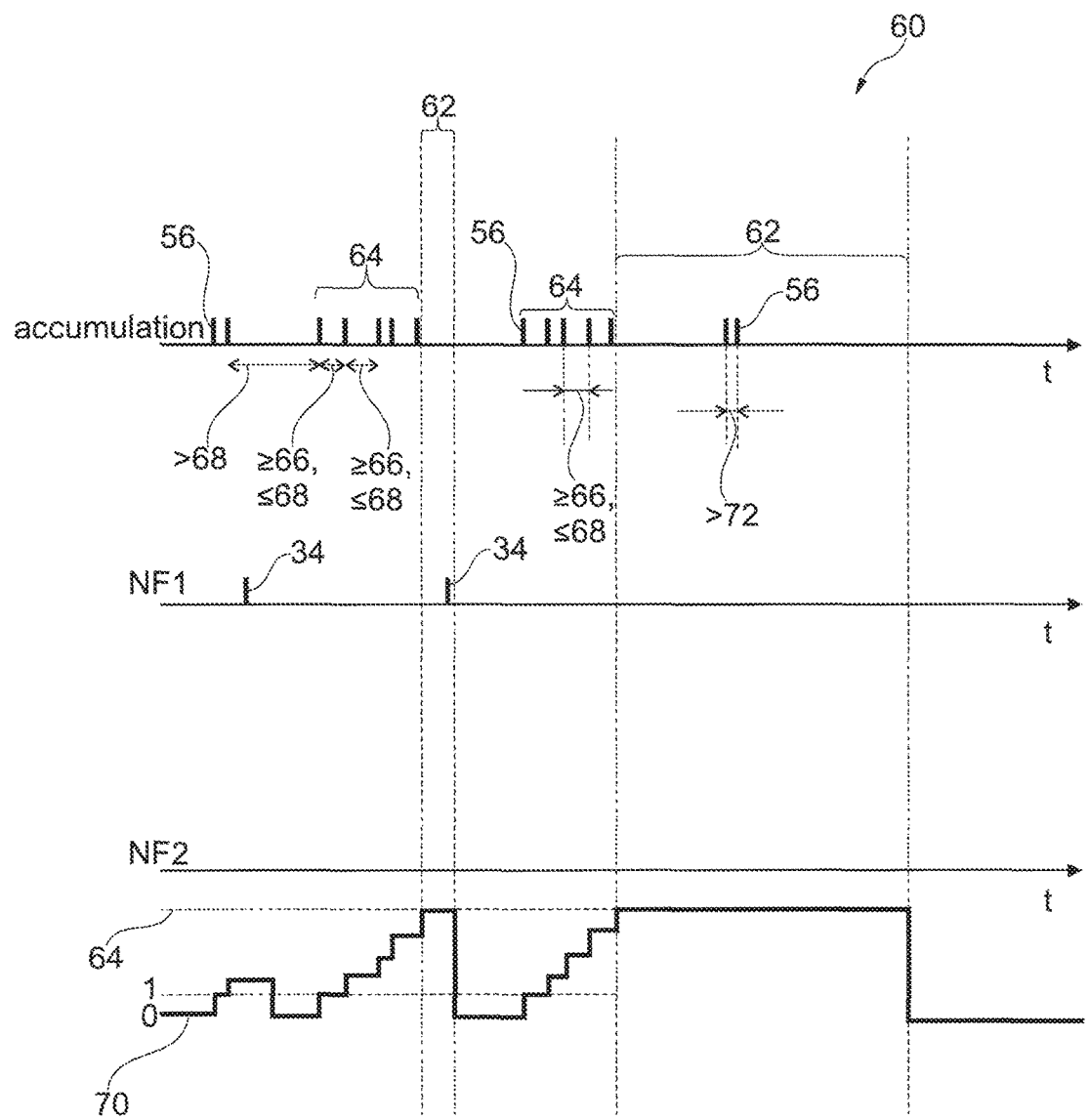
FIG. 5 shows a first method for identifying an arcing fault.

FIG. 5 illustrates a first method 60 for identifying the arcing fault 16. The temporal profile of the measurement of a number of accumulations 56 within the electrical circuit 2 is illustrated at the top. Each line symbolizes an accumulation 56, wherein the length of each of the accumulations 56 can vary. Underneath that the figure shows the temporal profile of the measurement of LF1 signals 34, and underneath that in turn the figure shows the temporal profile of the measurement of LF2 signals 40. In this case, too, the length of the LF1 signals 34 varies, whereas for example no LF2 signal 40 is measured.

If a number of accumulations 56 occurs, a waiting period 62 is started, which amounts to 100 ms, in particular. The number of accumulations 56 which lead to the start is equal to an accumulation value 64 amounting to five, in particular. In this case, the time interval between in each case two of the accumulations 56 is greater than or equal to a first accumulation time 66 and less than or equal to a second accumulation time 68. The first accumulation time 66 is 1.6 ms, for example, and the second accumulation time 68 is 23 ms, in particular. The accumulations 56 are suitably counted by means of a WET1 accumulation counter 70. In each case at the beginning of the method 60, the WET1 accumulation counter 70 is set to zero (0). For every case where the WET1 accumulation counter 70 is zero (0), the counter reading of the WET1 accumulation counter 70 is incremented by one (1) as soon as an accumulation 56 is identified within the electrical current 22 of the electrical circuit 2 (step S5 in FIG. 10). Whenever an incrementing of the WET1 accumulation counter 70 is followed by a further accumulation 56, the time interval between which and the temporally preceding accumulation 56 is greater than or equal to the first accumulation time 66 and less than or equal to the second accumulation time 68, the WET1 accumulation counter 70 is incremented a further time. If the time interval between two successive accumulations 56 is less than or greater than the first accumulation time 66 or the second accumulation time 68, the WET1 accumulation counter is reset to zero (0) (step S6 in FIG. 10).

After the counter reading of the WET1 accumulation counter 70 has reached the accumulation value 64, the waiting period 62 is started (step S7 in FIG. 10). If, within the waiting period 64, an LF1 signal 34 is measured or two successive accumulations 56 have a time interval which is less than a third accumulation time 72, then the waiting period 62 is terminated and the WET1 accumulation counter 70 is set to zero (0) (step S8 in FIG. 10). The third accumulation time 72 is suitably equal to 1.5 ms. Accumulations 56 having a time interval which is greater than the third accumulation time 72 have for example no influence on the waiting period 62 and the WET1 accumulation counter 70.

After the termination of the waiting period 62, upon each further accumulation 56 the WET1 accumulation counter is incremented by one (1) as long as the accumulations 56 meet the above criteria. If, within the waiting period 62, no LF1 signal 34 is measured, and possible accumulations 56 have a time interval which is greater than the third accumulation time 72, a report 74 of the arcing fault 16 is output (step S9 in FIG. 10).

Figure 6:
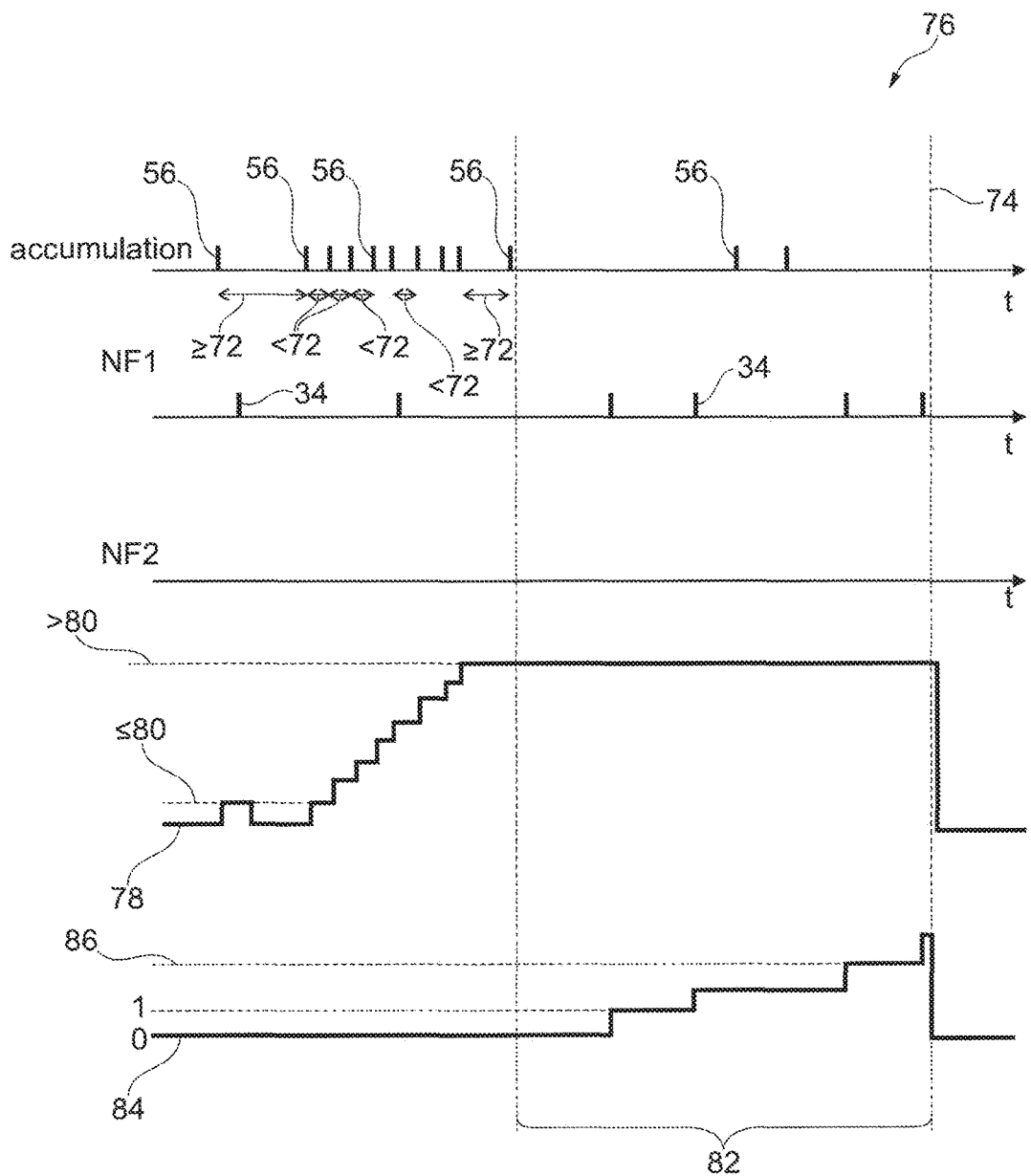
FIG. 6 shows a second method for identifying an arcing fault.

FIG. 6 shows a further method 76 for identifying the arcing fault 16 in accordance with FIG. 5. In this method 76, the accumulations 56 present in the electrical current 22 are counted. In contrast to the above method 60, only the accumulations 56 whose time interval is less than the third accumulation time 72 are counted in this method 76.

In this case, a WET2 accumulation counter 78 is expediently used. At the beginning of the method 76, the counter reading of the WET2 accumulation counter 78 is set to zero (0). Whenever the WET2 accumulation counter 78 is zero (0), the counter reading of the WET2 accumulation counter 78 is incremented by one (1) as soon as an accumulation 56 is identified within the electrical current 22 of the electrical circuit 2. Upon each further identified accumulation 56, the time interval between which and the temporally directly preceding accumulation 56 is less than the third accumulation time 72, the WET2 accumulation counter 78 is incremented by one (1). As soon as an accumulation 56 has a time interval relative to the previous accumulation 56 which is greater than the third accumulation time 72, the WET2 accumulation counter 78 is checked. If the counter reading is less than or equal to a first WET2 limit value 80, then the WET2 accumulation counter 78 is reset to zero (0). If the WET2 accumulation counter 78 exceeds the first WET2 limit value 80, then an LF period 82 is started. The first WET2 limit value 80 is suitably six and the LF period 82 is 20 ms, in particular.

Within the LF period 82, an LF1 counter 84 becomes active. At the beginning of the LF period 82, the LF1 counter 84 is set to zero (0) and is incremented by one (1) with each LF1 signal 34 measured within the LF period 82. If the LF1 counter 84 exceeds a second WET2 limit value 86, then the report 74 of the arcing fault 16 is output and, in particular, the LF period 82 is ended. Advantageously, the second WET2 limit value 86 is equal to three. If, after the LF period 82, the number of measured LF1 signals 34 is less than or equal to the second WET2 limit value 86, the LF1 counter 84 and the WET2 accumulation counter 78 are set to zero (0) and the method 76 is restarted.

Figure 7:
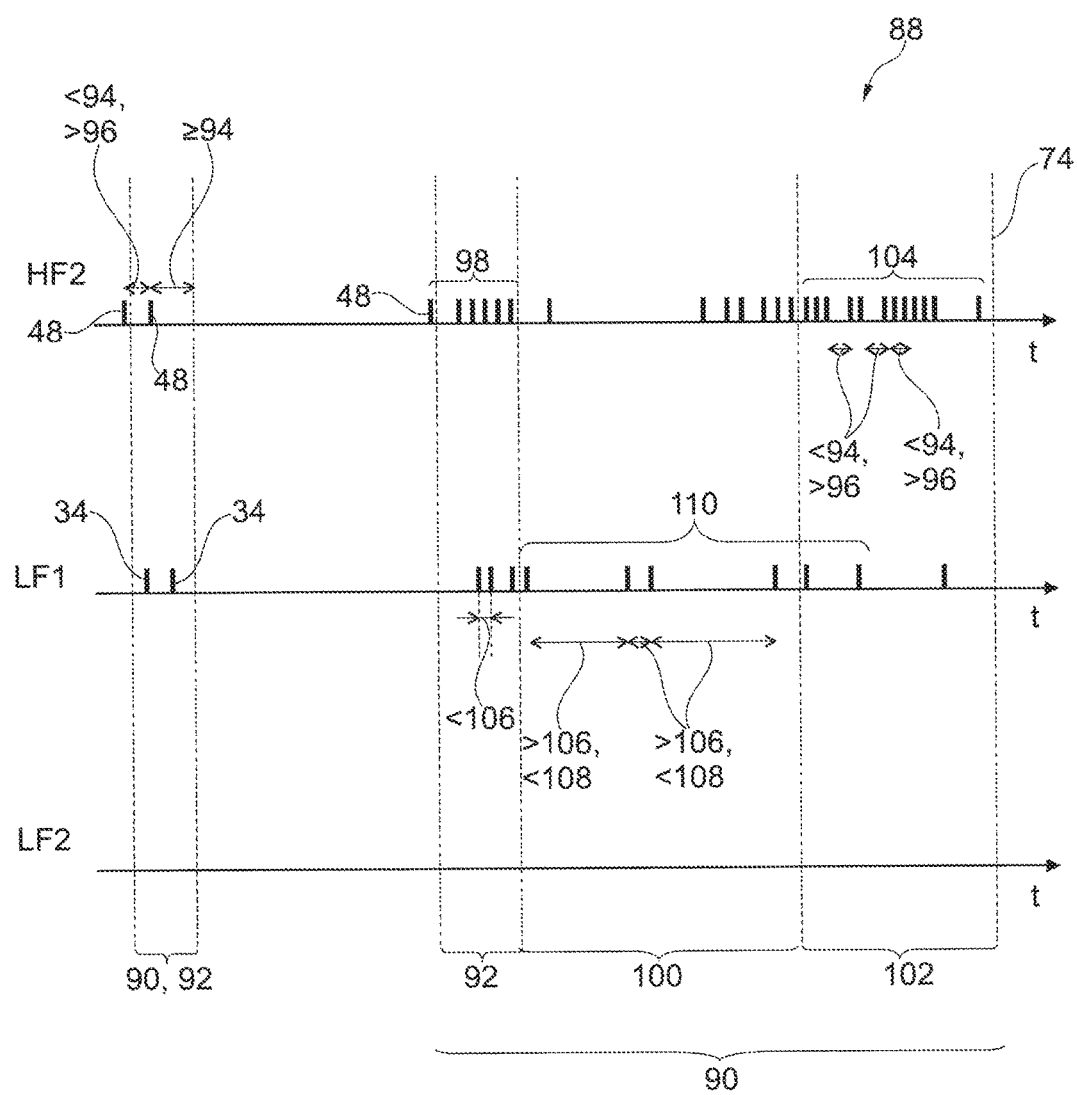
FIG. 7 shows a third method for identifying an arcing fault.

A further method 88 for identifying the arcing fault 16 is illustrated in FIG. 7. The temporal profile of the measurement of a number of the HF2 signals 48 within the electrical circuit 2 is illustrated at the top. Each line symbolizes one of the HF2 signals 48, wherein the length of each of the HF2 signals 48 can vary. In the middle the figure shows the temporal profile of the measurement of the LF1 signals 34, and at the bottom the figure shows the temporal profile of the measurement of LF2 signals 40. In this case, too, the length of the LF1 signals 34 varies, whereas for example no LF2 signal 40 is measured.

Each HF2 signal 48 which is present in the electrical current 22 and which was measured outside a serial time period 90 starts a serial time period 90, which begins with a first measurement phase 92. The HF2 signal 48 that starts the serial time period 90 is counted as being part of the serial time period 90 and the first measurement phase 92 and is illustrated slightly earlier in time merely for elucidation purposes. In the first measurement phase 92, the possible HF2 signals 48 present in the electrical current 22 are counted. In this case, however, only the HF2 signals 48 are counted whose time interval relative to the respective temporally directly preceding HF2 signal 48 lies between a third termination time span 94 and a fourth termination time span 96. Preferably, the third termination time span 94 is equal to 200 ms and the fourth termination time span 96 is 300 µs, for example.

If, within the first measurement phase 92, the time interval between two temporally directly successive HF2 signals 48 is greater than the third termination time span 94, both the first measurement phase 92 and the serial time period 90 are terminated. In other words, the first measurement phase 92 and the serial time period 90 are terminated if no further HF2 signal is measured for the third termination time span 94 after the temporally last HF2 signal 48. This is the case for example after the second of the HF2 signals 48 illustrated.

If a number of HF2 signals 48 including the HF2 signal 48 that brings about the start of the serial time period 90 is counted within the first measurement phase 92, which number is equal to a first serial number 98, then the first measurement phase 92 is ended and a holding period 100 is started. The first serial number 98 is six, for example. In particular, possible measured HF2 signals 48 are not taken into account within the holding period 100. That means that neither their number nor their respective length nor the time interval between two HF2 signals 48 has an effect on the holding period 100. The holding period 100 suitably has a length of between 30 ms and 220 ms. By way of example, the length of the holding period 100 is dependent on the magnitude of the electrical current 22 and in particular on the rated current thereof. In the case of a comparatively high rated current, the holding period 100 is for example greater than in the case of a comparatively low rated current. Advantageously, the length of the holding period 100 is variable during the operation of the electrical circuit 2.

The holding period 100 is followed directly by a second measurement phase 102. Within the second measurement phase 102, in a manner comparable with the first measurement phase 92, those HF2 signals 48 are counted whose time interval relative to the respective temporally directly preceding HF2 signal 48 lies between the third termination time span 94 and the fourth termination time span 96. Likewise, the second measurement phase 102 and the serial time period 90 are also terminated if, within the second measurement phase 102, the time interval between two temporally directly successive HF2 signals 48 is greater than the third termination time span 94.

The second measurement phase 102 is ended if, within the second measurement phase 102, the number of HF2 signals 48 counted in accordance with the above description corresponds to a second serial number 104. Preferably, the second serial number 104 is equal to twelve. The serial time period 90 is also ended with the second measurement phase 102. The LF1 signals 34 which are counted within the entire serial time period 90 and whose time interval relative to one another lies between a fifth termination time span 106 and a sixth termination time span 108 are checked after the end of the second measurement phase 102. The fifth termination time span 106 is advantageously equal to 8.3 ms and the sixth termination time span 108 is expediently 200 ms. If the number of such LF1 signals 34 is greater than a third serial number 110, then the arcing fault 16 is reported.

The third serial number 110 is suitably equal to six. The report 74 of the arcing fault is likewise output if the number of such LF1 signals 34 is equal to the third serial number 110 and no further LF1 signal 34 was measured in the electrical current 22 after the temporally last of such LF1 signals 34 for at least a time period that is greater than or equal to the fifth termination time span 106.

Seven LF1 signals 34 of this type are shown within the second of the serial time periods 90 illustrated. By way of example, the first two LF1 signals 34 of the second serial time period 90 have between one another a time interval which is less than the fifth termination time span 106, for which reason these two LF1 signals 34 are not taken into account during the check. By contrast, the respective time interval between all further LF1 signals 34 of the second serial time period 90 lies between the fifth termination time span 106 and the sixth termination time span 108.

Possible LF1 signals 34 additionally measured before or after such LF1 signals 34 within the serial time period 90 preferably have no effect on the report 74 of the arcing fault 16.

Figure 8:
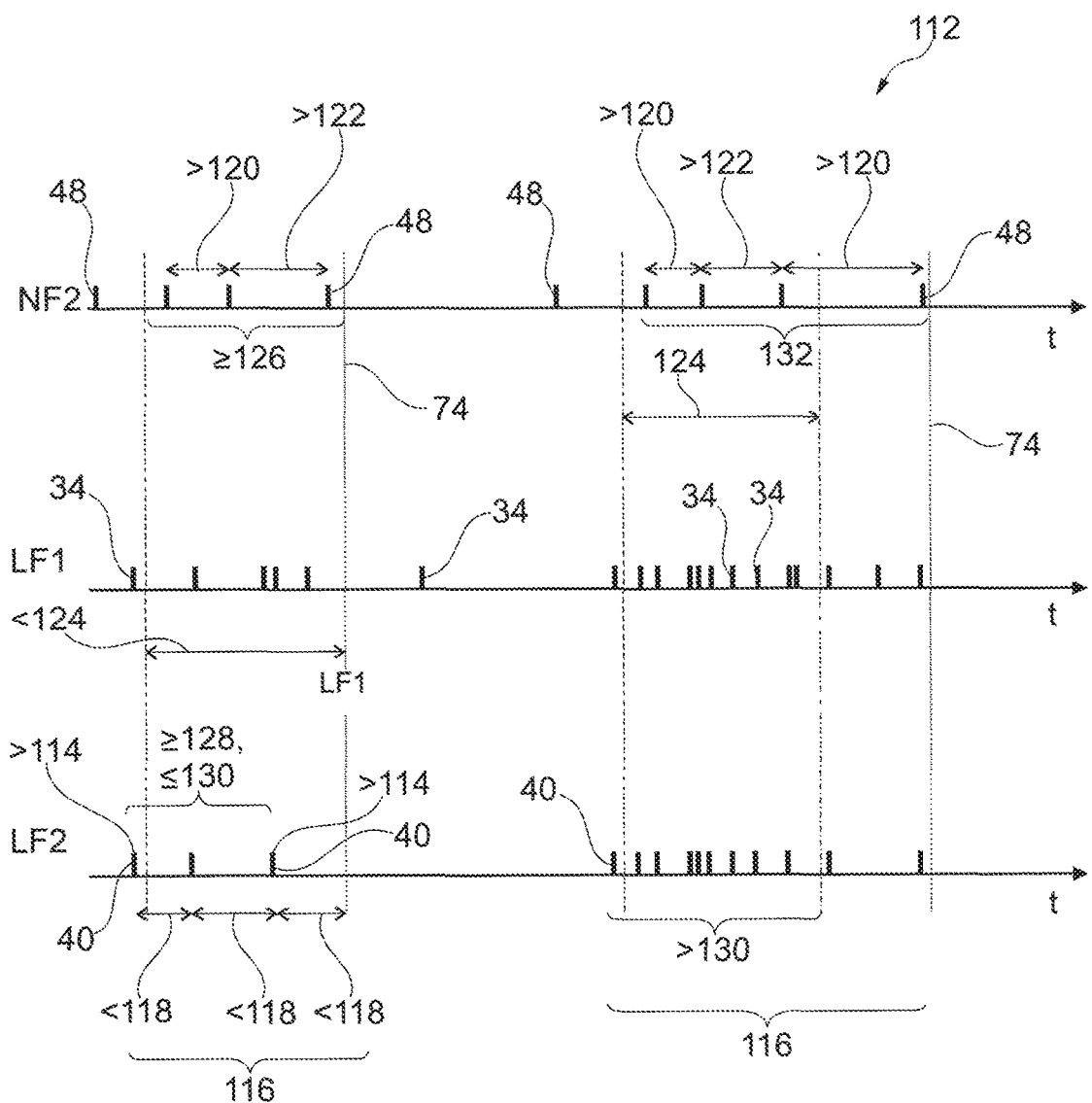
FIG. 8 shows a fourth method for identifying an arcing fault.

FIG. 8 shows a further method 112 for identifying the arcing fault 16 in accordance with FIG. 7. As soon as an LF2 signal 40 having a length greater than an LF2 limit length 114 is measured outside a parallel time period 116, the parallel time period 116 is started. In this case as well—in a manner comparable with the method 88 illustrated in FIG. 7—the LF2 signal 40 that starts the parallel time period 116 is counted as belonging to the parallel time period 116. The LF2 limit length 114 is equal to 200 µs, for example. During the parallel time period 116, all LF2 signals 40 having a length greater than or equal to the LF2 limit length 114 are counted and the parallel time period 116 is terminated if one of the lengths of the LF2 signals 40 is less than the LF2 limit length 114. The parallel time period 116 is likewise terminated if no LF2 signal 40 is measured for a second termination time span 118 within the parallel time period 116. In particular, the second termination time span 118 is equal to 500 ms. Likewise, an electrical voltage 24 which is less than a termination voltage for a first termination time span during the parallel time period 116 leads to a termination of the parallel time period 116. In this case, by way of example, the termination voltage is equal to 15 V and the first termination time span is 3.2 ms, in particular.

In addition to the LF2 signals 40, the HF2 signals 48 whose time interval relative to the respective temporally directly preceding HF2 signal 48 is greater than or equal to a first arcing fault time span 120, which is 500 µs, in particular, are counted within the parallel time period 116. Furthermore, a check is made to determine whether one of the intervals is greater than a second arcing fault time span 122. If this is the case, and the number of HF2 signals 48 measured in total within a third arcing fault time span 124 is greater than or equal to a first arcing fault number 126 and also the number of LF2 signals 40 measured within the third arcing fault time span 124 is greater than or equal to a second arcing fault number 128 and less than or equal to a third arcing fault number 130, the arcing fault 16 is reported. The third arcing fault time span 124 begins with the parallel time period 116 and suitably has a length of 25 ms. By way of example, the first arcing fault number 126 is three, the second arcing fault number 128 is three, in particular, and the third arcing fault number 130 is preferably seven.

In FIG. 8, by way of example, all LF2 signals 40 have a temporal length that is greater than the LF2 limit length 114, and the first of the two parallel time period 116 illustrated is started with the temporally first LF2 signal 40. Within this parallel time period 116, three LF2 signals 40 are measured including the LF2 signal 40 that triggers the start of this parallel time period 116, this number corresponding to the second arcing fault number 128. Three HF2 signals 48 are likewise measured during the parallel time period 116, this number being equal to the first arcing fault number 126. The interval between the first and the second of the HF2 signals 48 is greater than the first arcing fault time span 120, and the interval between the second and the third of the HF2 signals 48 is greater than the second arcing fault time span 122. Since three LF2 signals 40 were measured within the third arcing fault time span 124, after the temporally last of the three HF2 signals 48 the parallel time period 116 is ended and also the arcing fault 16 is reported.

The fourth of the LF2 signals 40 starts the second of the parallel time periods 116 illustrated. The temporal sequence of the HF2 signals 48 measured within the second of the parallel time periods 116 is for example identical to the temporal sequence of the HF2 signals 48 measured within the first of the parallel time periods 116. Within the third arcing fault time spans 124, nine LF2 signals 40 are measured including the LF2 signal 40 that triggers the start of the second of the parallel time periods 116. This number is greater than the third arcing fault number 130, for which reason the second parallel time period 116 is not ended after the third of the HF2 signals 48 measured within the second of the parallel time periods 116. It is only if a number of HF2 signals 40 was measured that corresponds to a fourth arcing fault number 132 that the arcing fault 16 is reported. The fourth arcing fault number 132 is four, in particular, for which reason the report 74 of the arcing fault 16 is output after the measurement of the fourth HF2 signal 48 of the second parallel time period 116, the time interval between this HF2 signal 48 and the HF2 signal 48 temporally directly preceding it being greater than or equal to the first arcing fault time span 120.

This method 112 suitably proceeds alternately with at least one further, preferably all, of the above methods 60, 76, 88. In this case, the further method is interrupted if one of the LF2 signal 40 is measured whose length is greater than the LF2 limit length 114. The further method is stopped during the parallel time period 116, which means that with the exception of the signals required for the method 112, namely the HF2 signals 48 and the LF2 signals 40, no further signal such as, for example, the LF1 signals 34 or the accumulations 56 are processed further. The HF2 signals 48 are moreover taken into account only in so far as they contribute to the method 112. In particular, neither the WET1 accumulation counter 70 nor the WET2 accumulation counter 78 nor the LF1 counter 84 is altered within the parallel time period 116. After the termination or end of the parallel time period 116, the further method is restarted, which results, in particular in a resetting of the respective counter or counters to zero (0).

Figure 9:
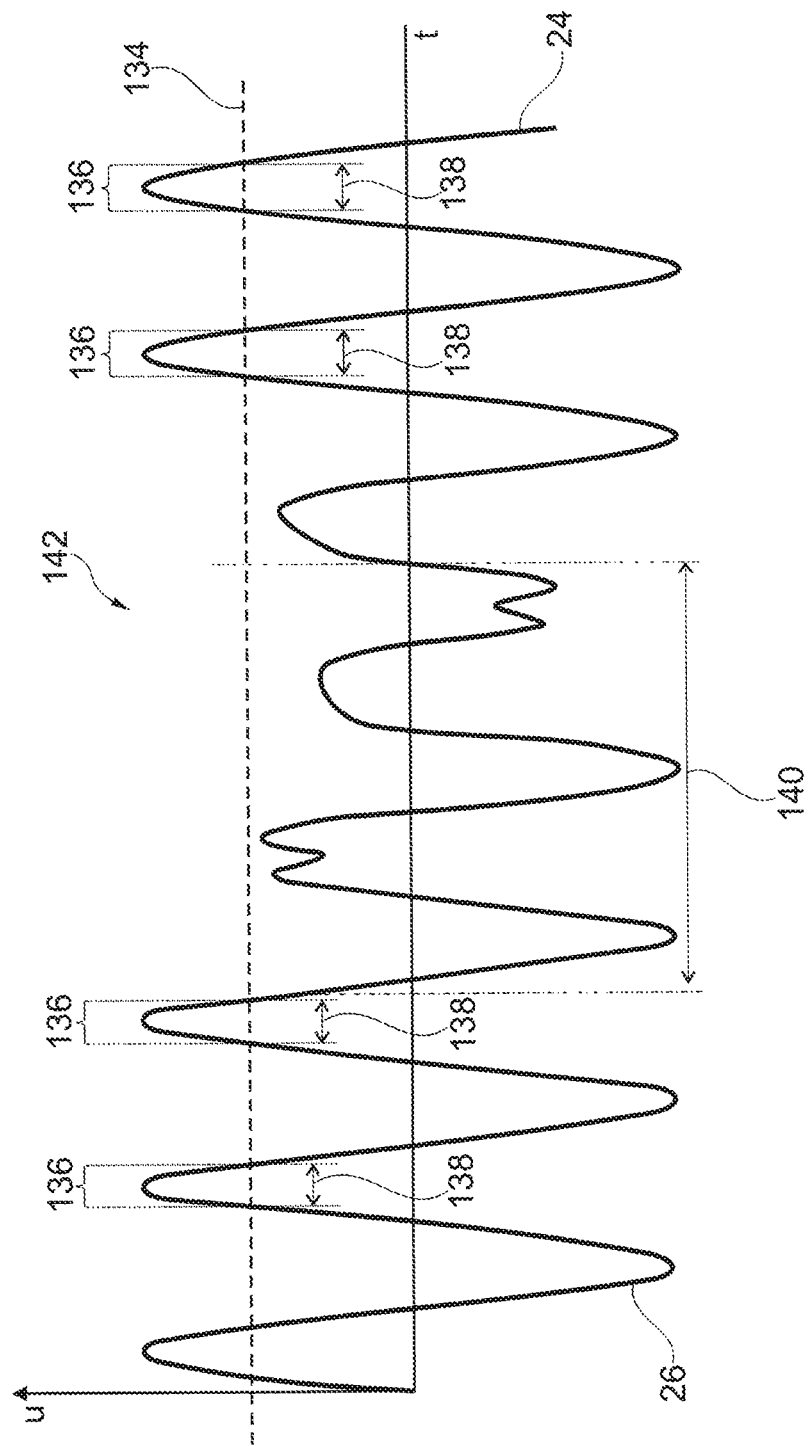
FIG. 9 shows the temporal profile of an electrical voltage.

FIG. 9 illustrates the temporal profile of the electrical voltage 24, which is substantially sinusoidal. On account of the temporal periodicity of the electrical voltage 24, the latter during normal operation regularly exceeds a limit value, designated as SPG voltage 134. The SPG voltage 134 is less than the rated voltage and is preferably 90 V. The time period within which the electrical voltage 24 is greater than the SPG voltage 134 is designated as a high time span 136. During normal operation, the length 138 of all the high time spans 136 is substantially identical and constant and, moreover, dependent on the system frequency 26. By way of example, the length 138 in normal operation is 600 µs. Likewise, the time interval between the individual high time spans 136 is substantially identical and constant and dependent on the system frequency 26. The time interval in normal operation is the reciprocal of the system frequency 26—that is to say 2.5 ms—minus the length 138 of the high time span 136. In particular, the time interval is 1.9 ms.

If, by way of example, one or a plurality of the interference signals 28 or the arcing fault 16 occur(s), or if the power drawn by the load 10 is changeable over time, then it is possible for the profile of the electrical voltage 24 to deviate from the sinusoidal form. By way of example, such influencing of the electrical voltage 24 has the consequence that the frequency of the electrical voltage 24 is disturbed, that is to say that the frequency is not constant, or that the maximum of the electrical voltage 24 is less than the rated voltage for a time period that is greater than double the reciprocal of the system frequency 26. If, therefore, the lengths 138 of two successive high time spans 136 differ by more than a third SPG time span or the electrical voltage 24 does not exceed the SPG voltage 134 for a second SPG time span 140, a problem of the electrical voltage 24 is identified, which problem is designated as SPG fault 142. The third SPG time span is suitably 100 µs and the second SPG time span is 6.4 ms, in particular.

Advantageously, in cases where an SPG fault 142 is identified within the electrical voltage 24, at least one of the above methods 76, 88 is terminated and not restarted for a time period having a length of a first SPG time span. In particular, neither the WET2 accumulation counter 78 nor the LF1 counter 84 is altered within the first SPG time span after the SPG fault 140. After the first SPG time span, the method or methods 76, 88 is/are restarted, which in particular results in a resetting of the respective counters to zero (0). The SPG time span is suitably 1 s.

The invention is not restricted to the exemplary embodiments described above. Rather, a person skilled in the art can also derive other variants of the invention therefrom, without departing from the subject matter of the invention. In particular, all individual features described in connection with the different exemplary embodiments can furthermore also be combined with one another in another way, without departing from the subject matter of the invention.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for identifying arcing faults within an electrical circuit comprising a system frequency, an electrical current, and an electrical voltage, the method comprising:
    detecting, by a processor, an interference signal;
    classifying, by the processor, each of the detected interference signal as a first signal if the interference signal occurring has a frequency below a first frequency and if a current intensity of the electrical current of the electrical circuit is above a current limit threshold, and as a second signal if the interference signal has a frequency below a second frequency;
    combining, by the processor, a number of second signals to form an HF2 signal if the number of the second signals occurring is greater than or equal to a predetermined minimum number for combination and if a time interval between two successive second signals is less than an HF2 time;

determining, by the processor, whether at least one HF2 signal is present in a predetermined time period that amounts to an accumulation length;

defining, by the processor, time periods as an accumulation if a number of succeeding predetermined time periods is greater than or equal to an accumulation number;

incrementing, by the processor, a WET1 accumulation counter by one if an accumulation is identified;

resetting, by the processor, the WET1 accumulation counter to zero if the time interval between two neighboring accumulations is less than a first accumulation time or greater than a second accumulation time;

starting, by the processor, a waiting period after an accumulation value has been reached for the WET1 accumulation counter;

terminating, by the processor, the waiting period and resetting the WET1 accumulation counter to zero if at least one first signal or two accumulations between which the time interval is less than a third accumulation time are measured within the waiting period; and identifying and/or reporting, by the processor, an arcing fault after the waiting period has elapsed, wherein the waiting period is terminated if this has already begun and the WET1 accumulation counter is reset to zero and left at zero for a parallel time period if a third signal is measured which has a duration longer than an LF2 limit length, wherein an interference signal occurring which has a frequency below a third frequency and a current intensity of the electrical current of the electrical circuit above an LF2 limit threshold is designated as the third signal, and wherein the parallel time period is ended if a measured third signal has a duration shorter than the LF2 limit length or the voltage for a first termination time span was less than a termination voltage or if no third signal was measured for a second termination time span, and wherein the arcing fault is detected and/or reported:

if within the parallel time period between all successive second signals, the time interval is greater than or equal to a first arcing fault time span;

if within the parallel time period between two directly successive second signals, the time interval is greater than or equal to a second arcing fault time span; or if either a number of second signals was measured which is greater than or equal to a first arcing fault number if, within a third arcing fault time span, a number of third signals was measured which lies between a second arcing fault number and a third arcing fault number, or if a number of second signals was measured which is greater than or equal to a fourth arcing fault number if, within the third arcing fault time span, a number of third signals was measured which is greater than the third arcing fault number, wherein the third arcing fault time span in each case begins with the parallel time period.

2. A circuit breaker which is provided and designed for carrying out the method as claimed in claim 1.

3. The circuit breaker as claimed in claim 2, comprising an interruption unit for interrupting an electrical circuit as soon as the arcing fault is identified and/or reported.

* * * * *